United States Patent
Zhang et al.

(10) Patent No.: US 11,011,461 B2
(45) Date of Patent: May 18, 2021

(54) PERPENDICULAR INDUCTORS INTEGRATED IN A SUBSTRATE

(71) Applicant: QUALCOMM Incorporated, San Diego, CA (US)

(72) Inventors: Shu Zhang, San Diego, CA (US); Daniel Daeik Kim, Del Mar, CA (US); Chenqian Gan, Shanghai (CN); Bonhoon Koo, San Diego, CA (US); Babak Nejati, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/254,735

(22) Filed: Jan. 23, 2019

(65) Prior Publication Data

US 2019/0252316 A1 Aug. 15, 2019

Related U.S. Application Data

(60) Provisional application No. 62/629,345, filed on Feb. 12, 2018.

(51) Int. Cl.

| | |
|---|---|
| *H01L 23/522* | (2006.01) |
| *H01L 49/02* | (2006.01) |
| *H01F 27/28* | (2006.01) |
| *H01F 41/04* | (2006.01) |
| *H01L 23/64* | (2006.01) |
| *H01F 17/02* | (2006.01) |
| *H01F 17/00* | (2006.01) |
| *H01L 23/498* | (2006.01) |

(52) U.S. Cl.
CPC ..... *H01L 23/5227* (2013.01); *H01F 17/0013* (2013.01); *H01F 17/02* (2013.01); *H01F 27/2804* (2013.01); *H01F 41/042* (2013.01); *H01L 23/49822* (2013.01); *H01L 23/645* (2013.01); *H01L 28/10* (2013.01); *H01F 2017/002* (2013.01); *H01F 2017/0073* (2013.01); *H01F 2027/2809* (2013.01)

(58) Field of Classification Search
None
See application file for complete search history.

(56) References Cited

U.S. PATENT DOCUMENTS

| | | | | |
|---|---|---|---|---|
| 6,420,773 | B1 * | 7/2002 | Liou | H01L 23/5227 257/528 |
| 8,058,960 | B2 * | 11/2011 | Hebert | H01L 23/645 336/200 |

(Continued)

FOREIGN PATENT DOCUMENTS

WO 02080279 A1 10/2002

OTHER PUBLICATIONS

International Search Report and Written Opinion—PCT/US2019/016483—ISA/EPO—dated Aug. 2, 2019.

*Primary Examiner* — Khaja Ahmad
(74) *Attorney, Agent, or Firm* — Qualcomm Incorporated

(57) ABSTRACT

Some features pertain to a substrate, and a first inductor integrated into the substrate. The first inductor includes a plurality of first inductor windings in a first metal layer and a second metal layer. A second inductor is integrated into the substrate. The second inductor includes a first spiral in a third metal layer. The first spiral is located at least partially inside the plurality of first inductor windings, wherein the second inductor is perpendicular to the first inductor.

15 Claims, 13 Drawing Sheets

(56) References Cited

U.S. PATENT DOCUMENTS

| | | | |
|---|---|---|---|
| 2004/0104449 A1* | 6/2004 | Yoon | H01F 17/0013 |
| | | | 257/528 |
| 2004/0227608 A1* | 11/2004 | Nakatani | H01P 5/10 |
| | | | 336/173 |
| 2008/0297299 A1 | 12/2008 | Yun et al. | |
| 2013/0049919 A1* | 2/2013 | Cho | H01F 17/0013 |
| | | | 336/84 C |
| 2014/0138792 A1 | 5/2014 | Lo et al. | |
| 2015/0130021 A1* | 5/2015 | Kim | H01L 28/10 |
| | | | 257/531 |
| 2016/0020013 A1* | 1/2016 | Berdy | H01F 27/29 |
| | | | 336/200 |
| 2017/0011837 A1 | 1/2017 | Hassan-Ali et al. | |

* cited by examiner

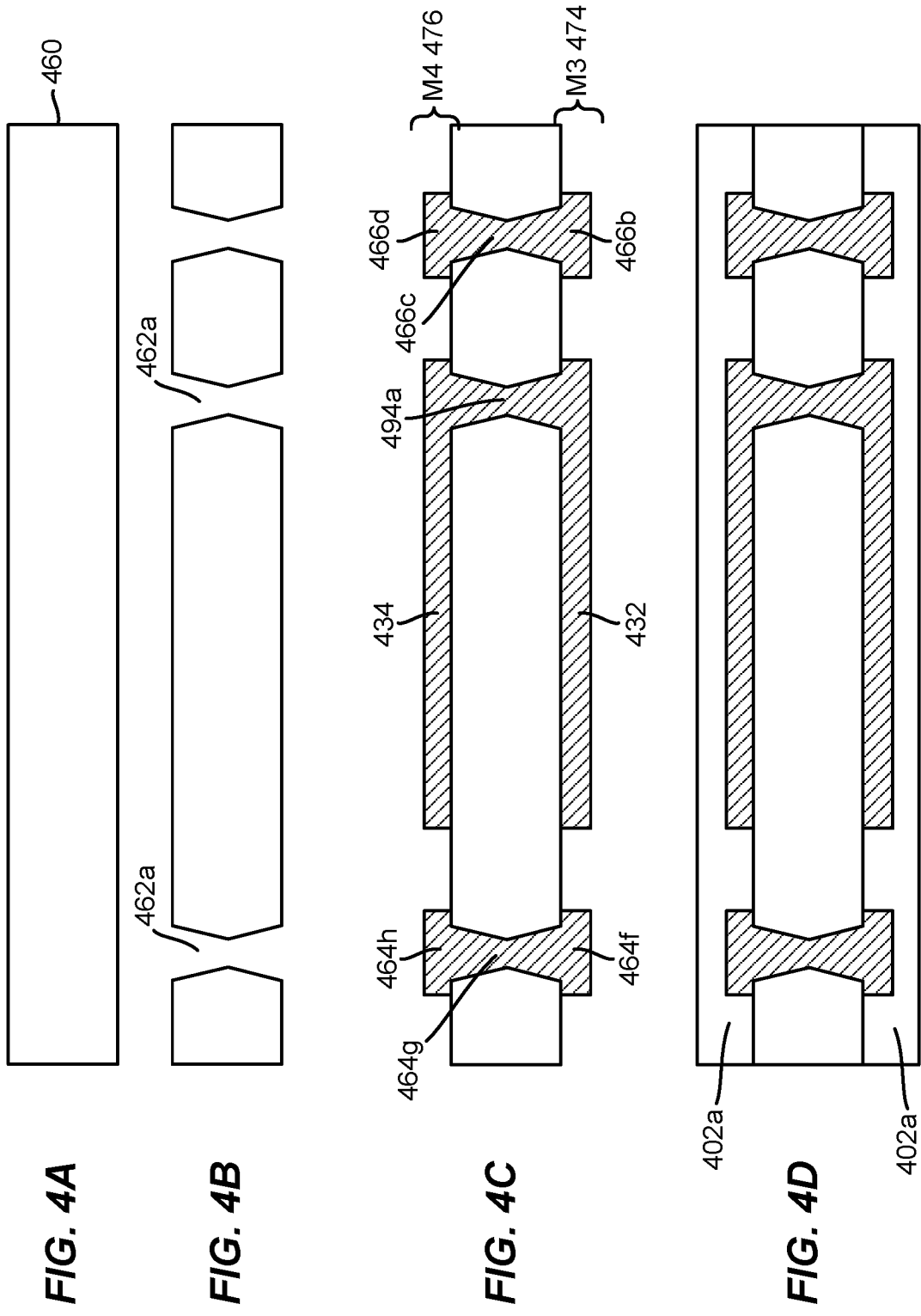

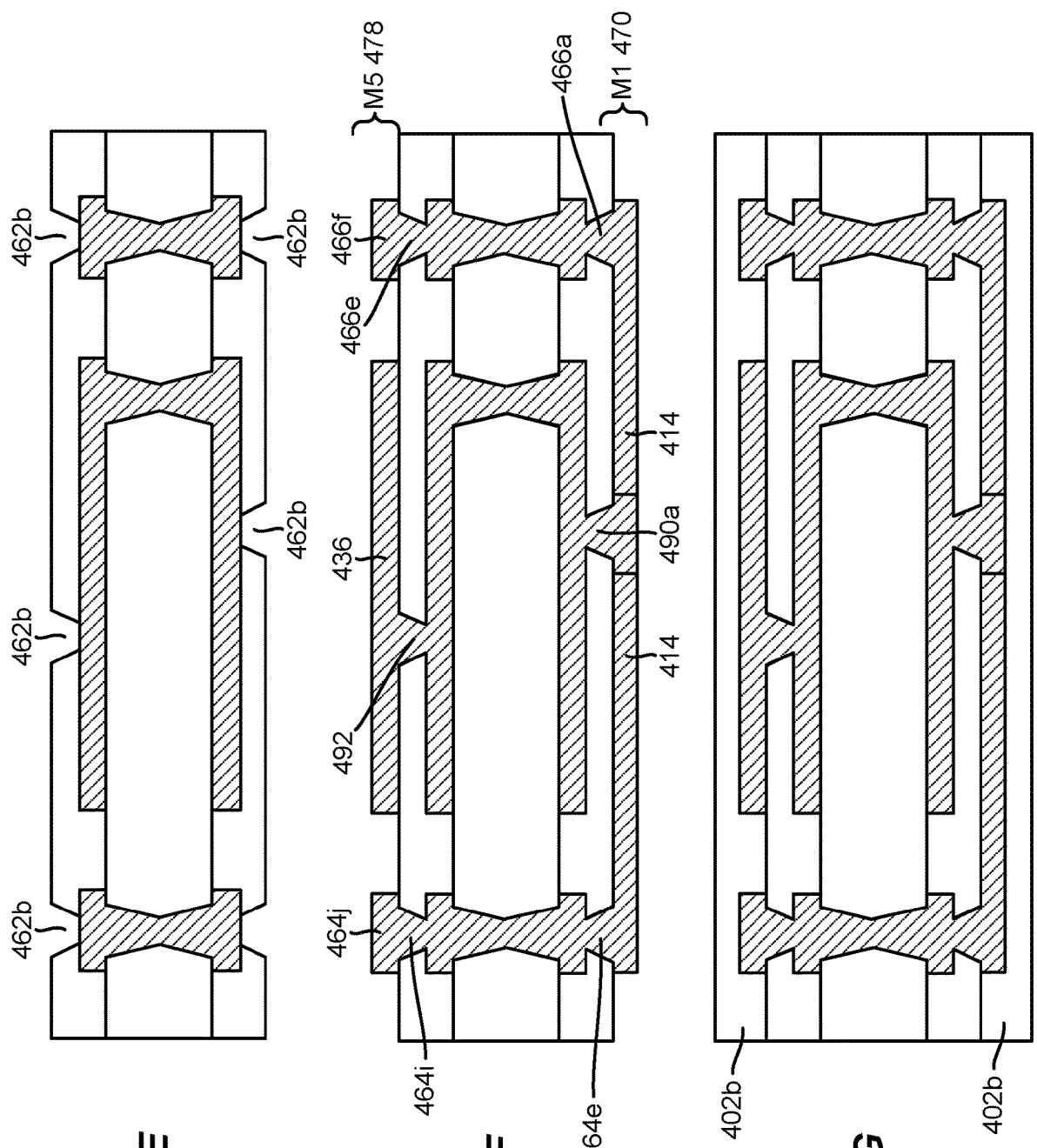

PERPENDICULAR INDUCTORS INTEGRATED IN A SUBSTRATE

CLAIM OF PRIORITY UNDER 35 U.S.C. § 119

The present Application for patent claims priority to Provisional Application No. 62/629,345 entitled "PERPENDICULAR INDUCTORS INTEGRATED IN A SUBSTRATE" filed Feb. 12, 2018, and assigned to the assignee hereof and hereby expressly incorporated by reference herein.

BACKGROUND

Field of the Disclosure

Various features relate to perpendicular inductors integrated in a substrate.

Background

Integrated circuits, substrates and electronic devices are being continually driven to smaller form factors. Devices such as inductors and duplexers are integrated into the substrate to achieve space savings. As the form factor of the substrate is reduced, challenges exist in making inductors and duplexers smaller. Moreover, electromagnetic interference between such devices is also a challenge.

FIG. 1A illustrates a cross-section view of a die and a substrate. Specifically, FIG. 1A illustrates a die 120 coupled to a substrate 102. Although not shown, the substrate 102 includes a plurality of metal layers and a plurality of vias, surrounded by a plurality of dielectric layers.

FIG. 1B illustrates a top view of the substrate of FIG. 1A. Specifically, FIG. 1B illustrates the substrate 102 and a first inductor 110, a second inductor 112, and a third inductor 114. Each of the first 110, second 112, and third inductors 114 are integrated in the substrate 102, and each include a number of inductor loops. This is achieved by coupling the metal layers and the vias together to form the inductor loops.

To achieve space savings, the first 110, second 112, and third inductors 114 may be formed smaller (i.e. a diameter of the inductor loops may be smaller and the inductors may be formed with a minimum number of metal layers). However, this is undesirable because it reduces quality factor Q. As an alternative, the first 110, second 112, and third inductors 114 may be located so that they are very close to one another (for example by increasing the inductor loop size). However, this is undesirable because it increases the electromagnetic interference between each of the first 110, second 112, and third inductors 114. To avoid electromagnetic interference, a shielding wall 104 must be placed between the first 110, second 112, and third inductors 114. The shielding wall 104 takes up valuable space on the substrate 102.

Accordingly, there is need in the industry for compact inductors with high Q, that may be placed near each other with reduced electromagnetic interference.

SUMMARY

Various features relate to perpendicular inductors integrated in a substrate.

A first example provides a substrate, and a first inductor integrated into the substrate. The first inductor includes a plurality of first inductor windings in a first metal layer and a second metal layer. A second inductor is integrated into the substrate. The second inductor includes a first spiral in a third metal layer. The first spiral is located at least partially inside the plurality of first inductor windings, wherein the second inductor is perpendicular to the first inductor.

A second example provides a method of manufacturing a first inductor and second inductor. The method includes providing a substrate, plating a third metal layer to form a first spiral of the second inductor, plating a first metal layer to form a plurality of first segments of the first inductor; and plating a second metal layer to form a plurality of second segments of the first inductor, the first spiral of the second inductor located between the plurality of first segments and the plurality of second segments of the first inductor; the second inductor perpendicular to the first inductor.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to a first inductor and a second inductor integrated into a substrate. The second inductor is embedded in the first inductor. The second inductor is perpendicular to the first inductor. The first inductor is configured to generate a first magnetic field and the second inductor is configured to generate a second magnetic field. Because the second inductor is perpendicular to the first inductor, the first magnetic field is perpendicular to the second magnetic. Because the first magnetic field and second magnetic field are perpendicular to each other, the electromagnetic interference is reduced between the first inductor 210 and the second inductor 230. The first and second inductor take up a smaller amount of space as compared to FIG. 1B, because the second inductor is embedded in the first inductor and avoids the need of a shielding wall 104.

The first inductor includes first inductor windings that include a plurality of first segments in a first metal layer and a plurality of second segments in a second metal layer. The first metal layer is in first plane and the second metal layer is in a second metal plane above the first plane. The plurality of first segments are coupled to the plurality of second segments through a plurality of first interconnects and a plurality of second interconnects.

The second inductor includes a first winding in a third metal layer, the third metal layer is located in a third plane. The second inductor may include additional windings such as a second winding and a third winding in a fourth metal layer (in a fourth plane) and in a fifth metal layer (in a fifth plane) respectively. Each of the first winding, the second winding, and the third winding of the second inductor are located in the first inductor windings, between the plurality of first segments and the plurality of second segments of the first inductor.

Exemplary Perpendicular Inductors Integrated in a Substrate

Figure 2A:
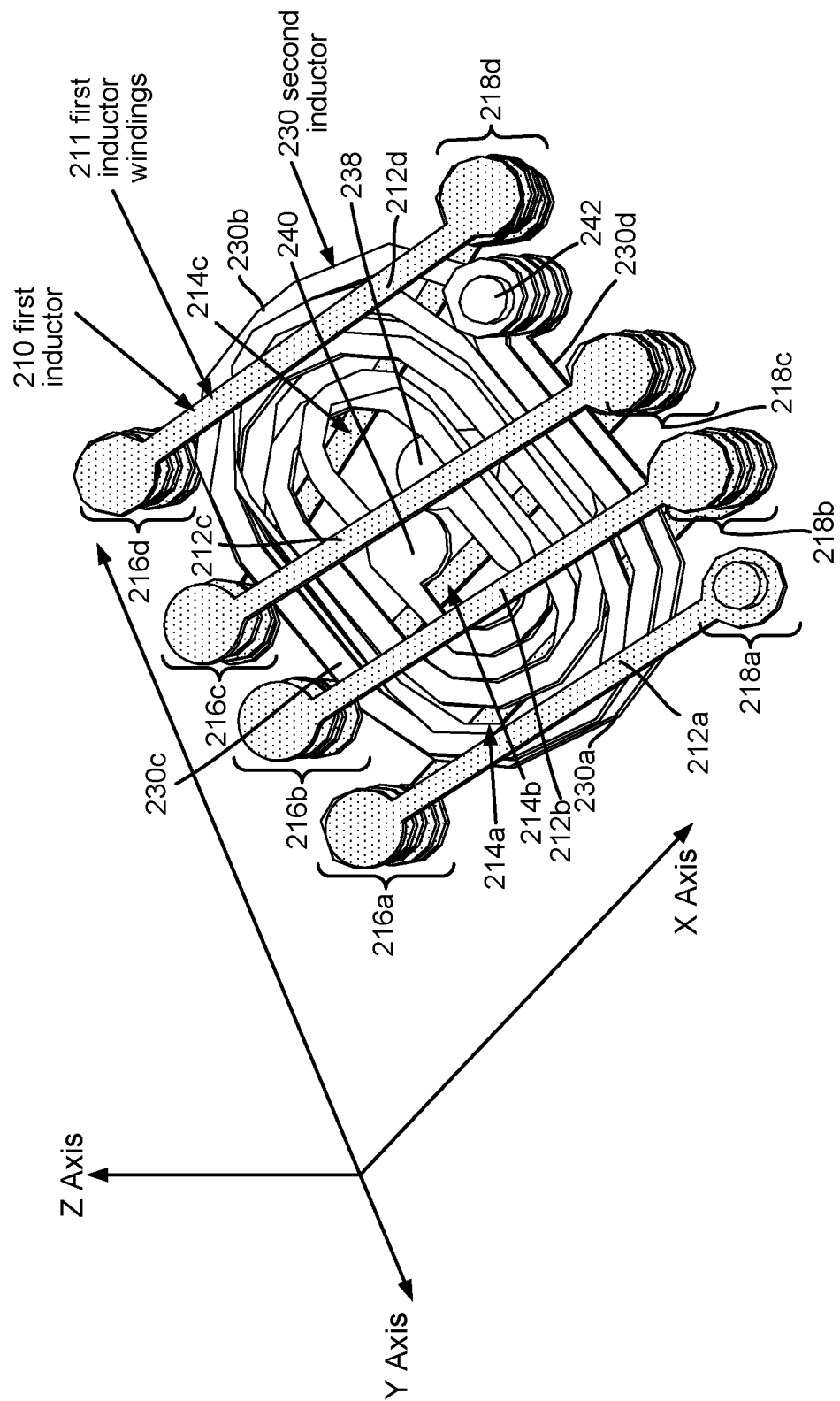
FIG. 2A illustrates a first and second inductor, perpendicular to each other, in the X, Y, and Z plane.

FIG. 2A illustrates a first and second inductor, perpendicular to each other, in the X, Y, and Z plane. Specifically, FIG. 2A illustrates a first inductor 210 and a second inductor 230, the second inductor 230 is at least partially embedded inside the first inductor 210 and perpendicular to the first inductor 210. The first inductor 210 and the second inductor 230 may be integrated into a substrate (see FIG. 2C and FIG. 3). The first inductor 210 and the second inductor 230 are distinct from each other and are not electrically coupled together.

The first inductor 210 includes a plurality of first inductor windings 211, a plurality of first interconnects 216, and a plurality of second interconnects 218. The plurality of first inductor windings 211 include a plurality of first segments 212, and a plurality of second segments 214.

In one aspect, the plurality of first segments 212 includes a first segment 212a, a third segment 212b, a fifth segment 212c and a seventh segment 212d. The plurality of first segments 212 are on a first plane and make up an upper portion of the first inductor 210. The plurality of second segments 214 includes a second segment 214a, a fourth segment 214b, and a sixth segment 214b. The plurality of second segments 214 are on a second plane and make up a lower portion of the first inductor 210.

The plurality of first interconnects 216 includes a first interconnect stack 216a, a third interconnect stack 216b, a fifth interconnect stack 216c, and a seventh interconnect stack 216d. The plurality of second interconnects 218 includes a second interconnect stack 218a, a fourth interconnect stack 218b, a sixth interconnect stack 218c, and an eighth interconnect stack 218d. Each one of the plurality of first interconnects (e.g., 216a-d) and each one of the plurality of second interconnects (e.g. 218a-d) may include a group of stacked vias and pads (as will be discussed later) that provide space for the second inductor 230. The plurality of first interconnects 216 and the plurality of second interconnects 218 are for coupling the plurality of first segments 212 to the plurality of second segments 214.

The first inductor windings 211 of the first inductor 210 are formed as follows: The first segment 212a extends from the second interconnect stack 218a to the first interconnect stack 216a, the first interconnect stack 216a is coupled to the second segment 214a, the second segment is coupled to the fourth interconnect stack 218b, the fourth interconnect stack 218b is coupled to the third segment 212b, the third segment 212b is coupled to a third interconnect stack 216b, the third interconnect stack 216b is coupled to a fourth segment 214b, the fourth segment 214b is coupled to the sixth interconnect stack 218c, the sixth interconnect stack 218c is coupled to the fifth segment 212c, the fifth segment 212c is coupled to the fifth interconnect stack 216c, the fifth interconnect stack 216c is coupled to the sixth segment 214c, the sixth segment 214c is coupled to the eighth interconnect stack 218d, the eighth interconnect stack 218d is coupled to the seventh segment 212d, and the seventh segment 212d is coupled to the seventh eighth interconnect stack 216d.

Figure 2B:
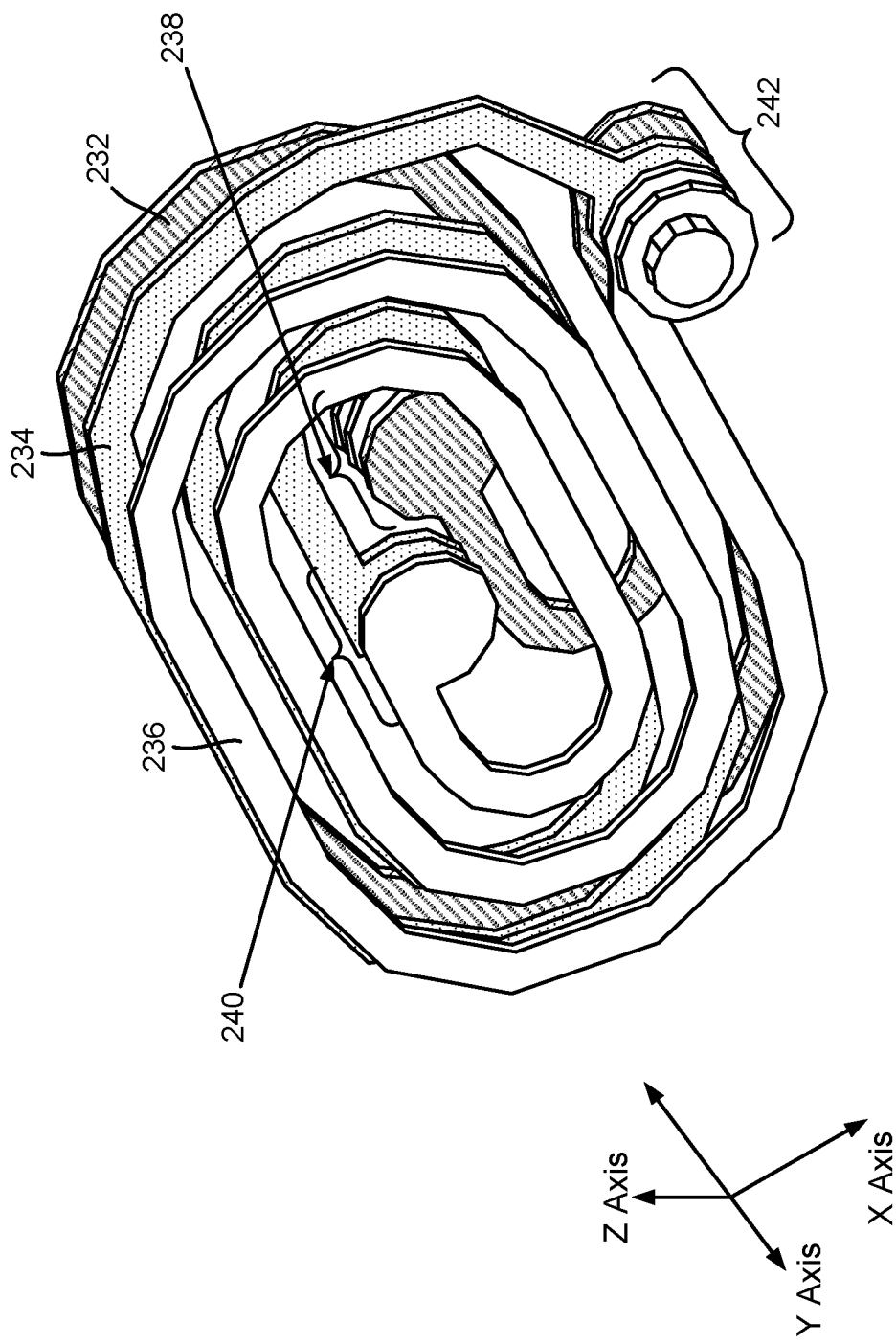
FIG. 2B illustrates the second inductor of FIG. 2A.

FIG. 2B illustrates the second inductor of FIG. 2A. For clarity, the second inductor 230 is shown separate from the first inductor 210. Specifically, FIG. 2B illustrates the second inductor 230 including: a first spiral 232 on a third plane, the first spiral 232 makes up a lower portion of the second inductor 230, a second spiral 234 on a fourth plane, the second spiral 234 makes up a middle portion of the second inductor 230, and a third spiral 236 on a fifth plane, the third spiral 236 makes up a top portion of the second inductor 230. Each of the first 232, second 234, and third spiral 236 is a winding on a single plane and may have more or less windings than what is shown in FIG. 2B.

The second inductor 230 includes a plurality of third interconnects 238, a plurality of fourth interconnects 240, and a plurality of fifth interconnects 242. The plurality of third interconnects 238 is configured to couple the second inductor 230 to other components or devices such a substrate (not shown).

The third spiral 236 extends from the plurality of fifth interconnects 242 to the forth interconnects 240. The second spiral 234 extends from the plurality of fourth interconnects 240 to the plurality of fifth interconnects 242. The first spiral 232 extends from the plurality of fifth interconnects 242 to the plurality of third interconnects 238. The plurality of fifth interconnects 242 is configured to couple the second inductor 230 to other devices such as another package, interposer or integrated circuit, or other circuits such as a duplexer (not shown).

Going back to FIG. 2A, the second inductor 230 includes a first side 230a, a second side 230b, a third side 230c, and a fourth side 230d. The second inductor 230 is located at least partially inside the plurality of first inductor windings 211. Specifically, the first spiral 232, the second spiral 234, and the third spiral 236 are located between the plurality of first segments 212 and the plurality of second segments 214 of the first inductor 210. Moreover, the third side 230c and the fourth side 230d of the second inductor 230 are bound by the plurality of first interconnects 216 and the plurality of second interconnects 218 of the first inductor 210. The first side 230a and a second side 230b of the second inductor 230 are not bound by the first inductor 210, and may extend beyond the first inductor 210.

FIG. 2A illustrates that the second inductor 230 is perpendicular to the first inductor 210. The first side 230a and the second side 230b of the second inductor 230 run parallel to the X axis. The third side 230c and the fourth side 230d of the second inductor 230 run parallel to the Y axis. This defines the current flow of the second inductor 230 in XY plane. Moreover, the plurality of first segments 212 and the plurality of second segments 214 of the first inductor 210 run parallel to the X axis. First interconnects 216 and second interconnects 218 of the first inductor 210 run parallel to the Z axis as shown in FIG. 2A. This defines the current flow of the first inductor 210 in XZ plane. Accordingly, the second inductor 230 is perpendicular to the first inductor 210.

It shall be understood that the first inductor 210 may have more or less first inductor windings than what is illustrated in FIG. 2A, depending on the amount of desired inductance. For example, the first inductor 210 may have more or less segments (e.g., the plurality of first segments 212 and the plurality of second segments 214) than what is shown in FIG. 2A. Moreover, the second inductor 230 may have more or less spirals (e.g., first 232, second 234, third spiral 236) and, or, each spiral may have more or less windings than what is shown, depending on the amount of desired inductance. For example, the second inductor 230 may have only a single spiral 232 (i.e., the second inductor may only take up a single plane). If more spirals are desired for the second inductor 230 (than what is shown in FIG. 2B), the plurality of first interconnects 216 and the plurality of second interconnects 218 and their corresponding interconnect stacks (e.g., 216a-d, 218a-d) may be increased to make space for the additional spirals.

Figure 2C:
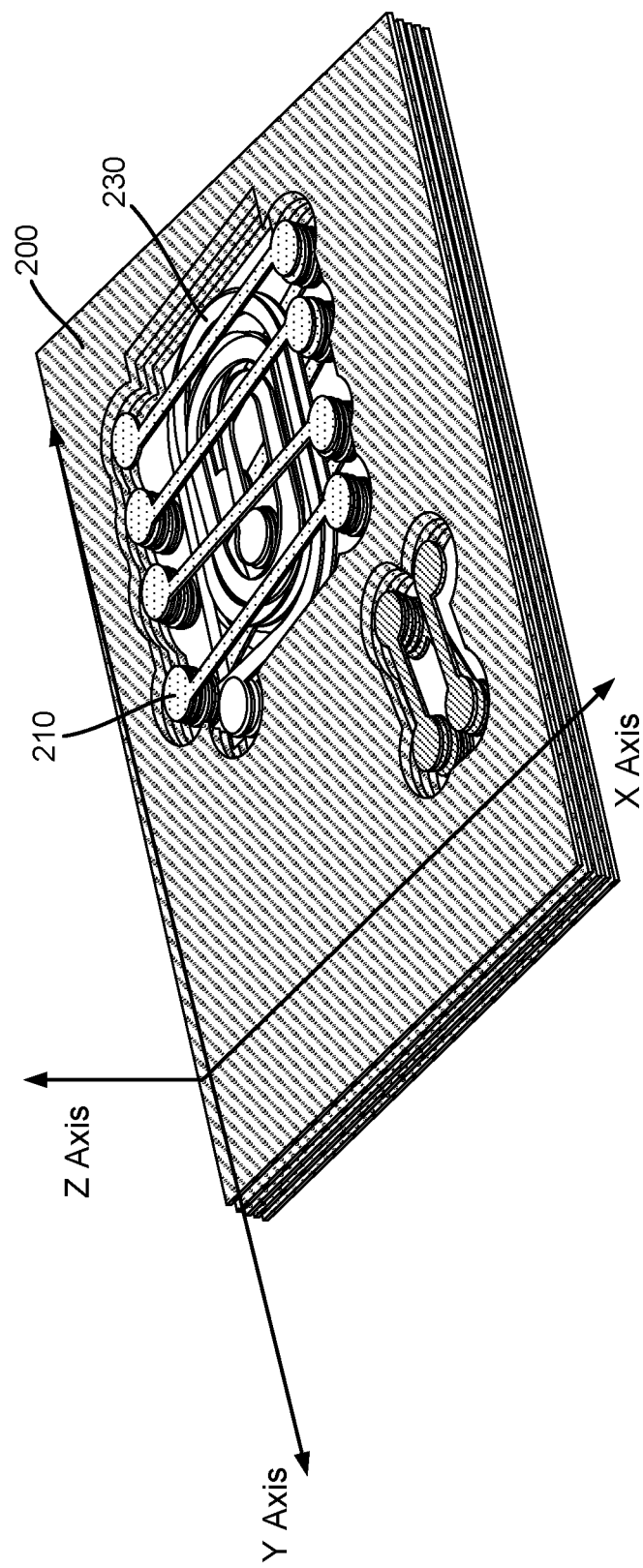
FIG. 2C illustrates the first inductor and the second inductor integrated in a substrate.

FIG. 2C illustrates the first inductor 210 and the second inductor 230 integrated in a substrate 200. The substrate 200 may be an integrated circuit (IC) substrate such as a silicon substrate. In another aspect, the substrate 200 may be a package substrate, a printed circuit board (PCB), an interposer, or a wafer level package. The substrate 200 is configured to couple to another device such as to a die, a package, or an interposer (not shown).

Figure 2D:
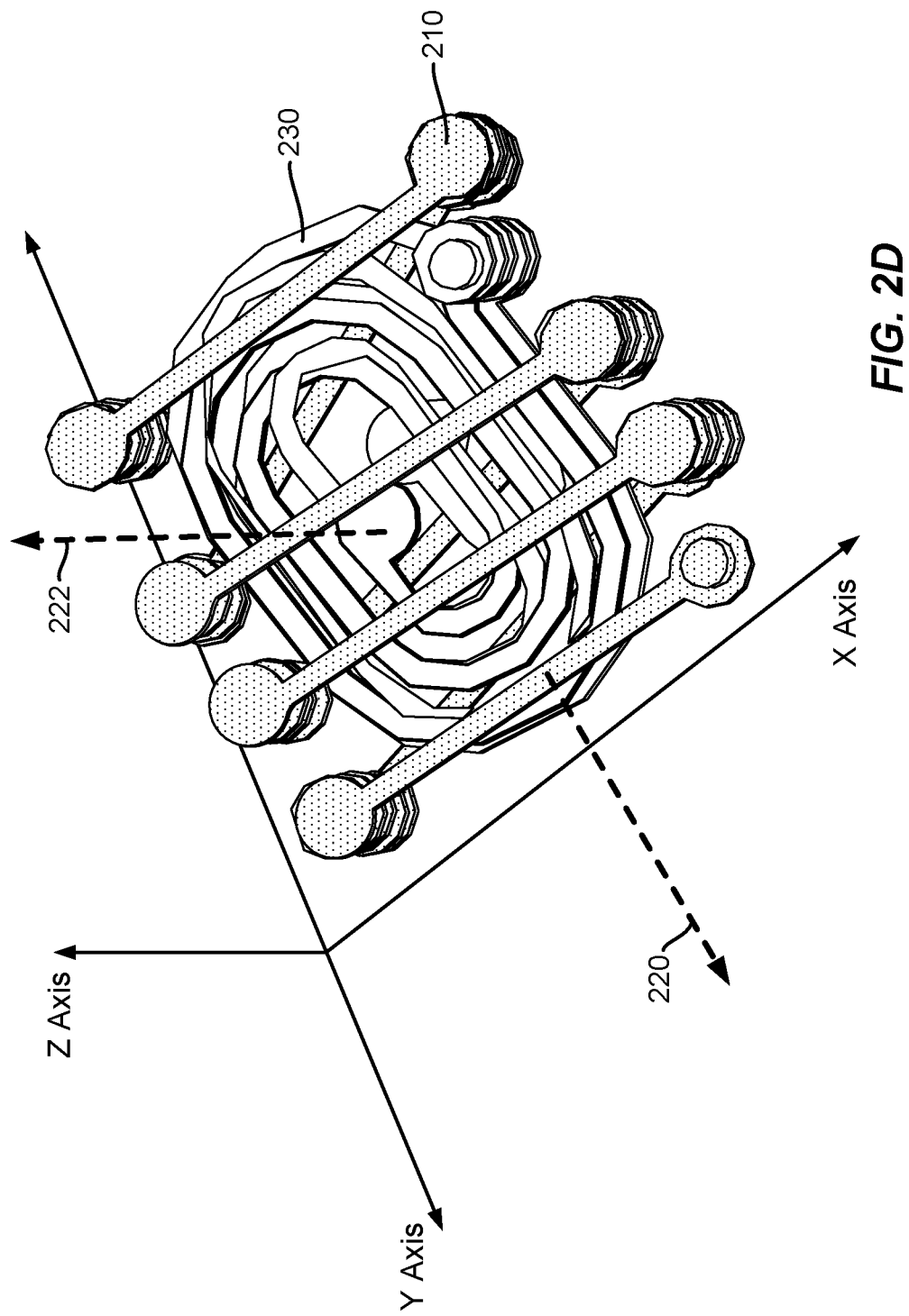
FIG. 2D illustrates a simplified view of the magnetic field of FIG. 2A.

FIG. 2D illustrates a simplified view of the magnetic field of the first inductor 210 and second inductor 230 of FIG. 2A. It shall be understood that FIG. 2C only shows some of the magnetic fields. The first inductor 210 is configured to generate a first magnetic field 222 in a first direction and the second inductor 230 is configured to generate a second magnetic field 220 in a second direction. The second direction is different from the first direction. The second direction of the second magnetic field 220 is perpendicular to the first direction of the first magnetic field 222.

The first magnetic field 220 (generated from the first inductor 210) is perpendicular to the second magnetic field 222 (generated from the second inductor 230). Because the first magnetic field 220 and the second magnetic field 222 are perpendicular to each other, this reduces the electromagnetic interference between the first inductor 210 and the second inductor 230.

Figure 1A:
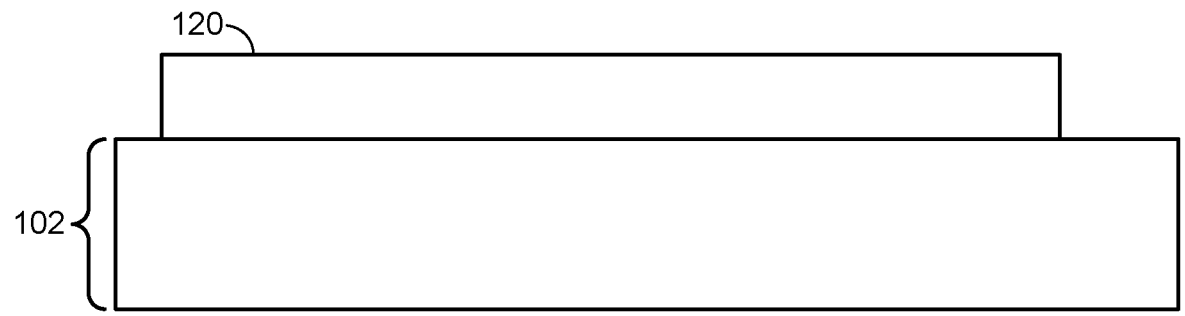
FIG. 1A illustrates a cross-section view of a die and a substrate.
Figure 1B:
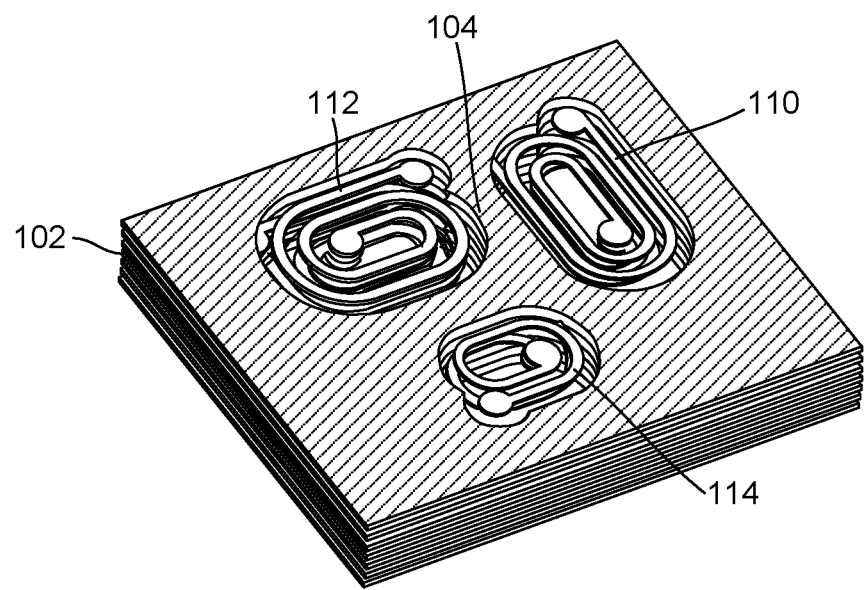
FIG. 1B illustrates a top view of the substrate of FIG. 1A

By partially embedding the second inductor 230 in the first inductor 210 as shown in FIG. 2D, rather than placing the second inductor separately on the substrate 102 as shown in FIG. 1B, a significant space savings in the X and, or Y axis can be achieved. Moreover, FIG. 1B requires a shielding wall 104 be placed between the first 110 and second inductors 112 to avoid electromagnetic interference. The shielding wall 104 takes up valuable space. However, because the second inductor 230 of FIG. 2A and FIG. 2D is perpendicular to the first inductor 210, electromagnetic interference is reduced.

Moreover, because of the smaller form factor of the perpendicular first inductor 210 and the second inductor 230, the substrate 200 may be reduced. The perpendicular first inductor 210 and the second inductor 230 integrated into the substrate 200 may be used in any type of application, including as a duplexer.

Figure 3:
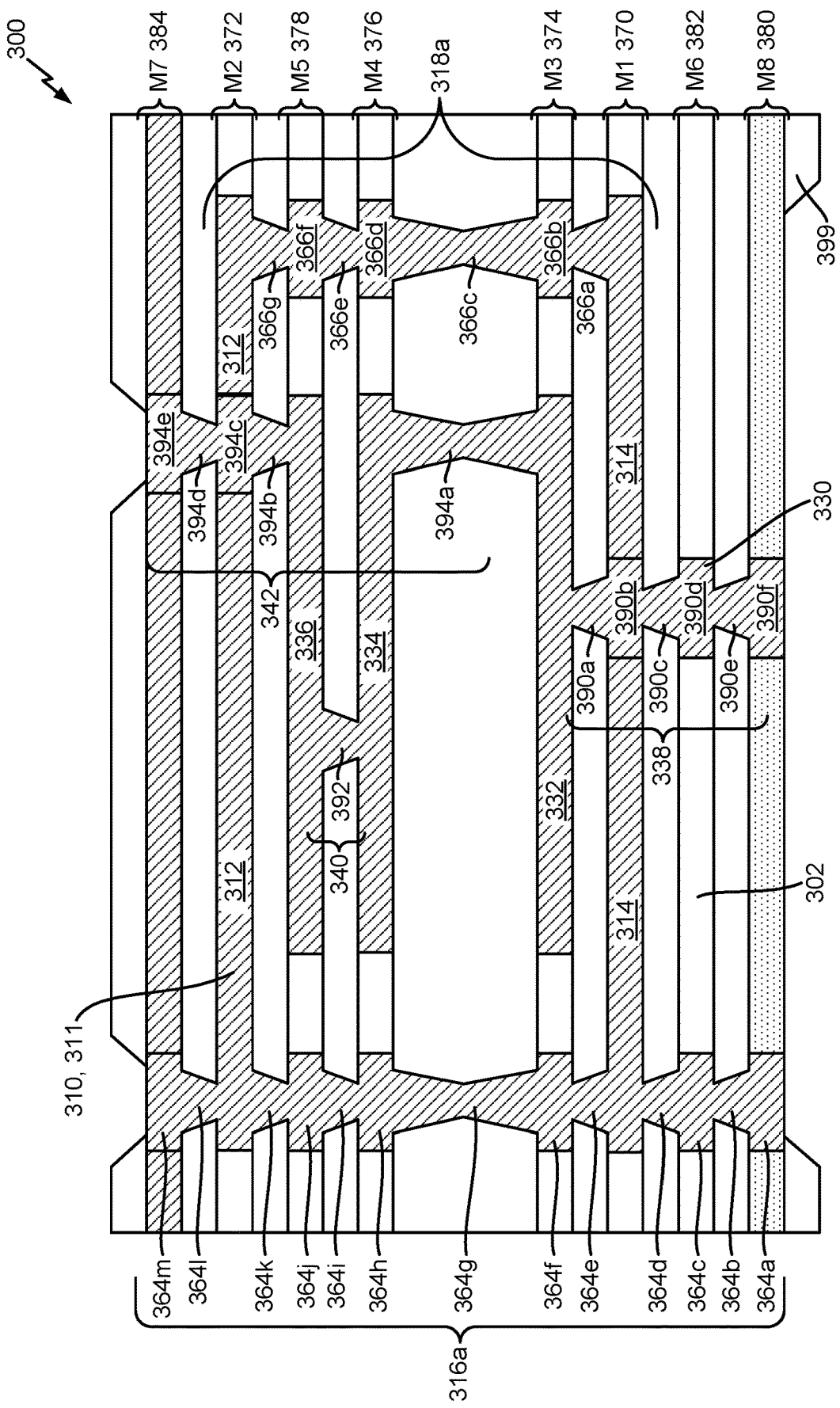
FIG. 3 illustrates a cross-section view of a first and second inductor, perpendicular to each other, integrated in a substrate.

FIG. 3 illustrates a cross-section view of a first and second inductor, perpendicular to each other, integrated in a substrate. Specifically, FIG. 3 illustrates a first inductor 310 and a second inductor 330 perpendicular to each other, integrated into a substrate 300. The substrate 300 is an eight-layer substrate including: a first metal layer 370, a second metal layer 372, a third metal layer 374, a fourth metal layer 376, a fifth metal layer 378, a sixth metal layer 382, a seventh metal layer 384, and an eighth metal layer 380. Each of the metal layers is in a separate plane (e.g., the first metal layer 372 is in a first plane, the second metal layer 374 is in a second plane etc.), stacked together. The substrate 300 is surrounded by a plurality of dielectric layers 302. The substrate 300 may have more or less metal layers (e.g. 370, 372, 374 etc.) and dielectric layers 302 than what is shown.

The first inductor 310 includes a plurality of first inductor windings 311 in the first metal layer 370 and the second metal layer 372. The plurality of first inductor windings 311 includes a plurality of first segments 312 in the second metal layer 372 and a plurality of second segments 314 in the first metal layer 370. The first inductor 310 includes a first interconnect stack 316a of a plurality of first interconnects 316 (see FIG. 2A for a view of the plurality of first interconnects 216 including first interconnect stack 216a). The first interconnect stack 316a of the plurality of first interconnects 316 includes vias 364e, 364g, 364i, 364k with pads 364f, 364h, 364j stacked between the vias, for coupling the plurality of first segments 312 in second metal layer 372 to the plurality of second segments 314 in the first metal layer 370. The first interconnect stack 316a of the plurality of first interconnects 316 also includes pads 364a, 364c, 364m and vias 364b, 364d, 3641 for coupling the first inductor 310 to other devices or components.

The first inductor 310 includes a second interconnect stack 318a of a plurality of second interconnects 318 (see FIG. 2A for a view of the plurality of second interconnects 218 including second interconnect stack 218a). The second interconnect stack 318a of the plurality of second interconnects 318 includes vias 366a, 366c, 366e, 366g and pads 366b, 366d, 366f stacked between the vias, for coupling the plurality of first segments 312 in in second metal layer 372 to the plurality of second segments 314 in first metal layer 370.

It shall be understood that the plurality of first segments 312 and the plurality of second segments 314 may include more or less segments than shown in FIG. 3. Moreover, the first interconnect stack 316a (and the plurality of first interconnects 316) and the second interconnect stack 318a (and the plurality of second interconnects 318) may have more, or less vias and pads than what is shown in FIG. 3. The number of vias and pads in the plurality of first interconnects 316 and the plurality of second interconnects 318 may be more or less, depending on the desired inductance and depending on the amount of space required for the second inductor 330 to be embedded in the first inductor windings 311.

The second inductor 330 includes a first spiral 332 in the third metal layer 374, a second spiral 334 in the fourth metal layer 376, and a third spiral 336 in the fifth metal layer 378.

The second inductor 330 includes a plurality of third interconnects 338 including: via 390a extending from the first spiral 332 to pad 390b, the pad 390b extending to the via 390c, the via 390c extending to the pad 390d, the pad 390d extending to the via 390e, the via 390e extending to the pad 390f. The plurality of third interconnects 338 for coupling the second inductor 330 to other devices or components.

The second inductor 330 includes a plurality of fourth interconnects 340 including via 392 extending from and coupling the third winding 336 to the second winding 334. The plurality of fourth interconnects 340 may include additional pads not shown.

The second inductor 330 includes a plurality of fifth interconnects including via 394b extending from the third winding to the pad 394c, the pad 394c coupled to the via 394d, the via 394d extending from the pad 394c to the pad 394e. The plurality of fifth interconnects 342 also includes via 394a.

Exemplary Sequence for Manufacturing Perpendicular Inductors Integrated in a Substrate In some implementations, manufacturing a substrate that includes embedded interconnects includes several sequences. FIG. 4 (which includes FIGS. 4A-4L) illustrates an exemplary sequence for manufacturing perpendicular inductors integrated in a substrate. In some implementations, the sequence of FIGS. 4A-4L may be used to manufacture the perpendicular inductors of FIGS. 2A-D and FIG. 3 and/or other perpendicular inductors described in the present disclosure. Although the sequence is illustrated in cross-section views, it will be appreciated that the perpendicular inductors are each, three dimensional inductors. It will be understood that FIG. 4A-4L refers to the first inductor 410, the second inductor 430 and the substrate 400 in various states of manufacture, however, the full first inductor 410 and second inductor 430 are shown in FIG. 4L.

FIG. 4A illustrates a core substrate 460. However, a coreless substrate may also be used.

FIG. 4B illustrates the core substrate 460 after a plurality of via holes 462a have been formed in the core substrate 460. The plurality of via holes 462a may be drilled or lasered.

FIG. 4C illustrates the core substrate 460 after metal plating. A first set of vias 464g, a second set of vias 466c, and a third via 494a are formed by filling the plurality of via holes 462a with conductive material such as metal. A third metal layer 474 and a fourth metal layer 476 are plated on both sides of the core substrate 460 to form: a first set of pads 464h and 464f coupled to the first set of vias 464g, and a second set of pads 466d and 466b coupled to the second set of vias 466c. Further, the third metal layer 474 is plated to form a first spiral 432 of the second inductor 430, and the fourth metal layer 476 is plated to form a second spiral 434 of the second inductor 430.

FIG. 4D illustrates FIG. 4C after a dielectric layer 402a is deposited over the third metal layer 474, the fourth metal layer 476 and exposed portions of the substrate core 460. The dielectric layer 402a may be deposited by lamination or other known methods.

FIG. 4E illustrates FIG. 4D after a plurality of via holes 462b have been formed in the dielectric layer 402a to expose the third metal layer 474 and the fourth metal layer 476.

FIG. 4F illustrates FIG. 4E after metal plating. A fourth set of vias 464i and a fifth set of vias 464e, a sixth set of vias 466e and a seventh set of vias 466a, an eighth set of vias 492, and a ninth set of vias 490a are formed by filling the plurality of via holes 462b with conductive material such as metal. A first metal layer 470 is plated to form a plurality of second segments 414 of the first inductor 410, the plurality of second segments 414 are coupled to the fifth set of vias 464e and the seventh set of vias 466a. Further, the first metal layer 470 is plated to form a third set of pads 490a. A fifth metal layer 478 is plated to form a fourth set of pads 464j coupled to the fourth set of vias 464i, and a fifth set of pads 466f coupled to the sixth set of vias 466e. Further, the fifth metal layer 478 is plated to form the third spiral 436 of the second inductor 430.

FIG. 4G illustrates FIG. 4F after a dielectric layer 402b is deposited over the fifth metal layer 478, the first metal layer 470 and exposed portions of the dielectric layer 402a.

Figure 4H:
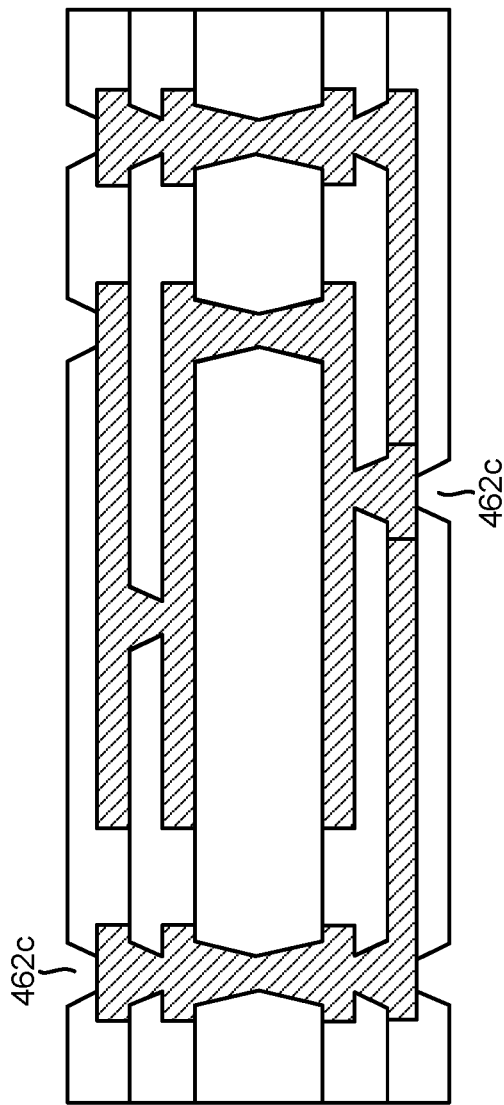
FIG. 4 (which includes FIGS. 4A-4L) illustrates an exemplary sequence for manufacturing perpendicular inductors integrated in a substrate.

FIG. 4H illustrates FIG. 4G after a plurality of via holes 462c have been formed in the dielectric layer 402c to expose portions of the first metal layer 470 and the fifth metal layer 478.

Figure 4I:
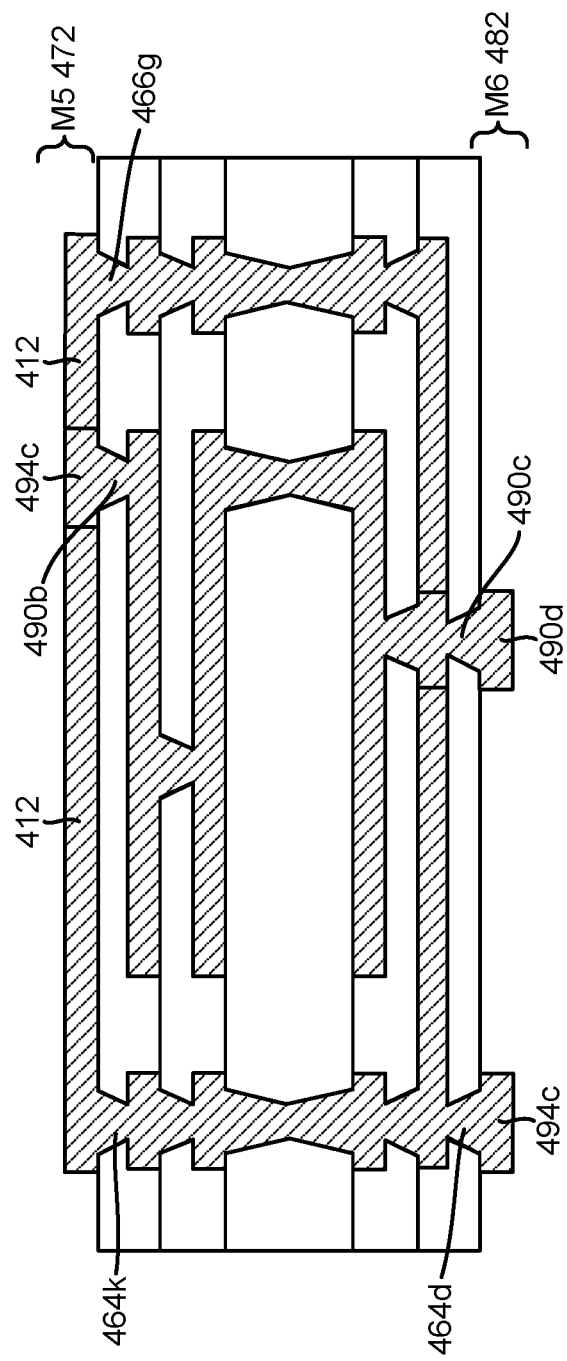

FIG. 4I illustrates FIG. 4H after metal plating. A tenth set of vias 464k and an eleventh set of vias 464d, a twelfth set of vias 466g, a thirteenth via 494b, and a fourteenth set of vias 490c are formed by filling the plurality of via holes 462c with conductive material. A sixth metal layer 482 is plated to form a fifth set of pads 464c coupled to the eleventh set of vias 464d and a sixth set of pads 490d coupled to the thirteenth via 490c. A second metal layer 472 is plated to form a plurality of first segments 412 of the first inductor 430, the plurality of first segments 412 are coupled to the tenth set of vias 464k and the twelfth set of vias 466g. Further, the second metal layer 472 forms the seventh pad 494c coupled to the thirteenth via 494b.

Figure 4J:
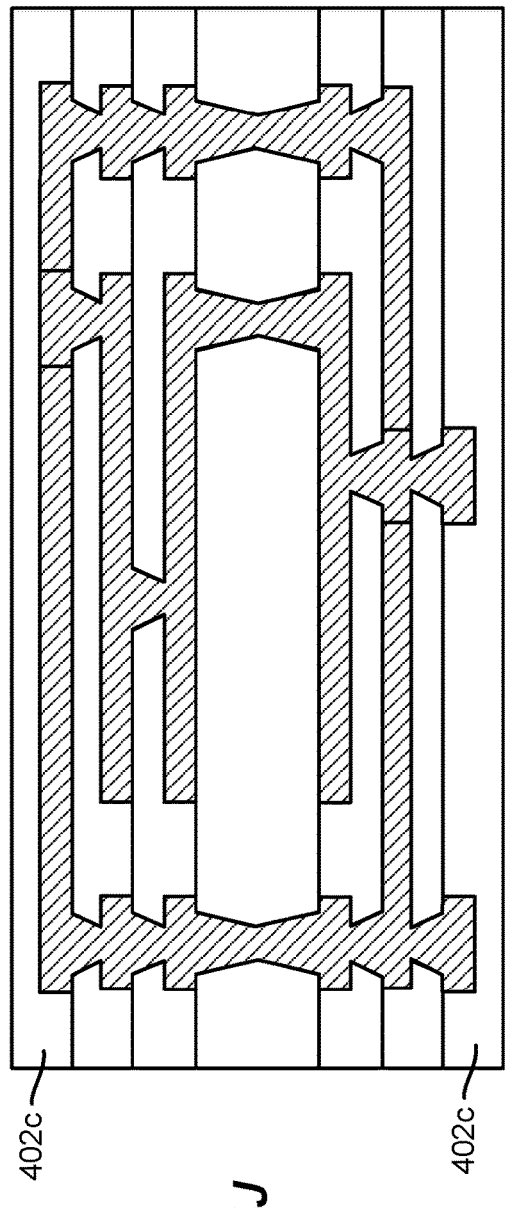

FIG. 4J illustrates FIG. 4I after a dielectric layer 402c is deposited over the sixth metal layer 482, the second metal layer 484 and exposed portions of the dielectric layer 402b.

Figure 4K:
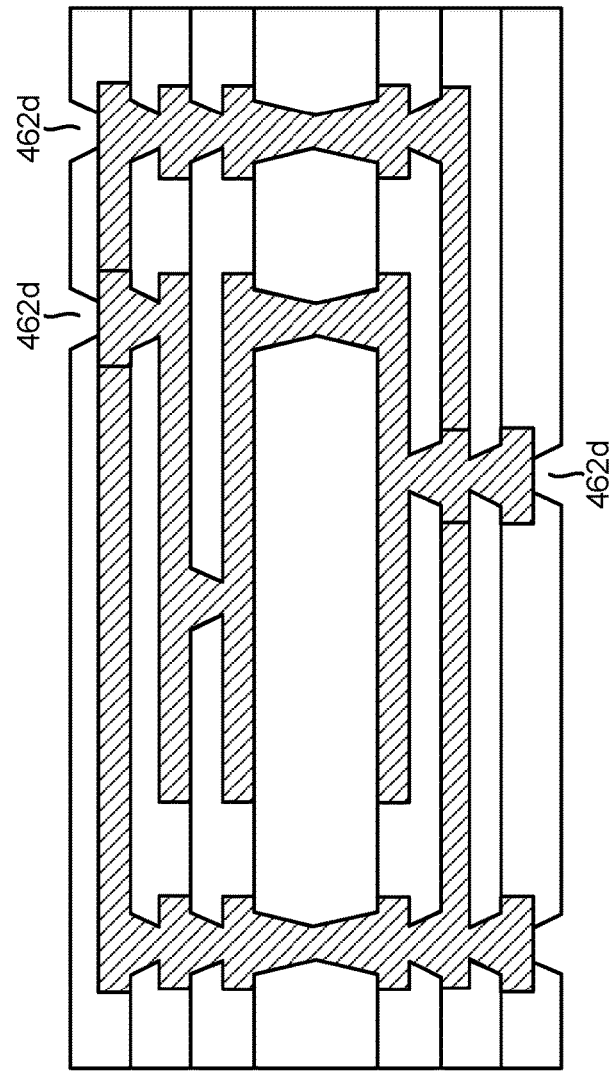
Figure 4L:
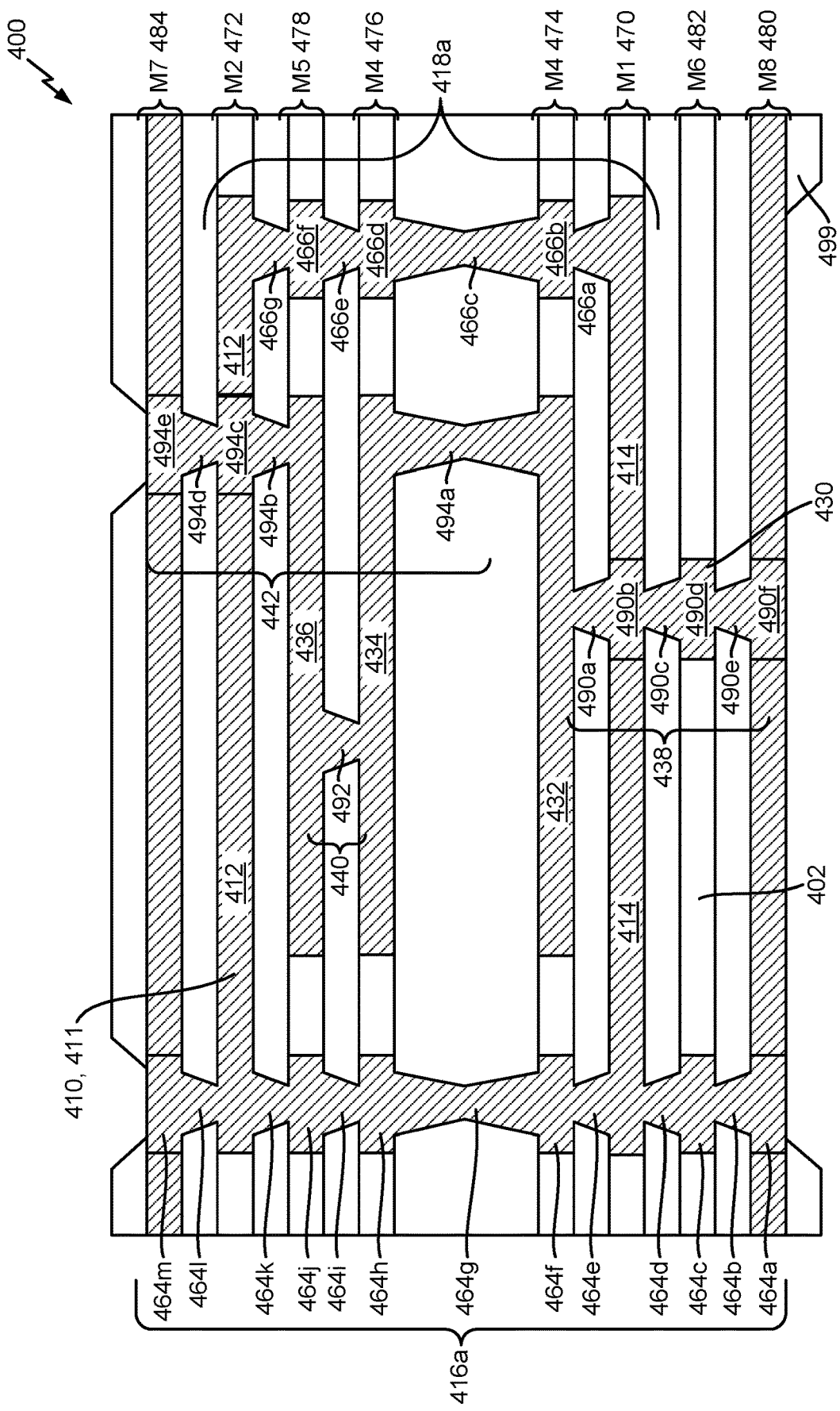

FIG. 4K illustrates FIG. 4J after a plurality of via holes 462d have been formed in the dielectric layer 402c to expose portions of the sixth metal layer 482 and the second metal layer 484.

FIG. 4L illustrates FIG. 4K after metal plating. A fifteenth set of vias 464l and sixteenth set of vias 464b, a seventeenth via 494d, and an eighteenth via 490e are formed by filling the plurality of holes 462d with a conductive material. A seventh metal layer 484 is plated to form an eighth pad 464m coupled to the fifteenth via 464l, and to form a ninth pad 494e coupled to the seventeenth via 494d. An eighth metal layer 480 is plated to form a tenth set of pads 464a coupled to the sixteenth set of vias 464b, and an eleventh pad 490f coupled to the eighteenth via 490e. Solder mask 499 may be deposited onto the substrate 400 and substrate 400 may be coupled to other devices such as an integrated circuit or another substrate or interposer.

Figure 5:
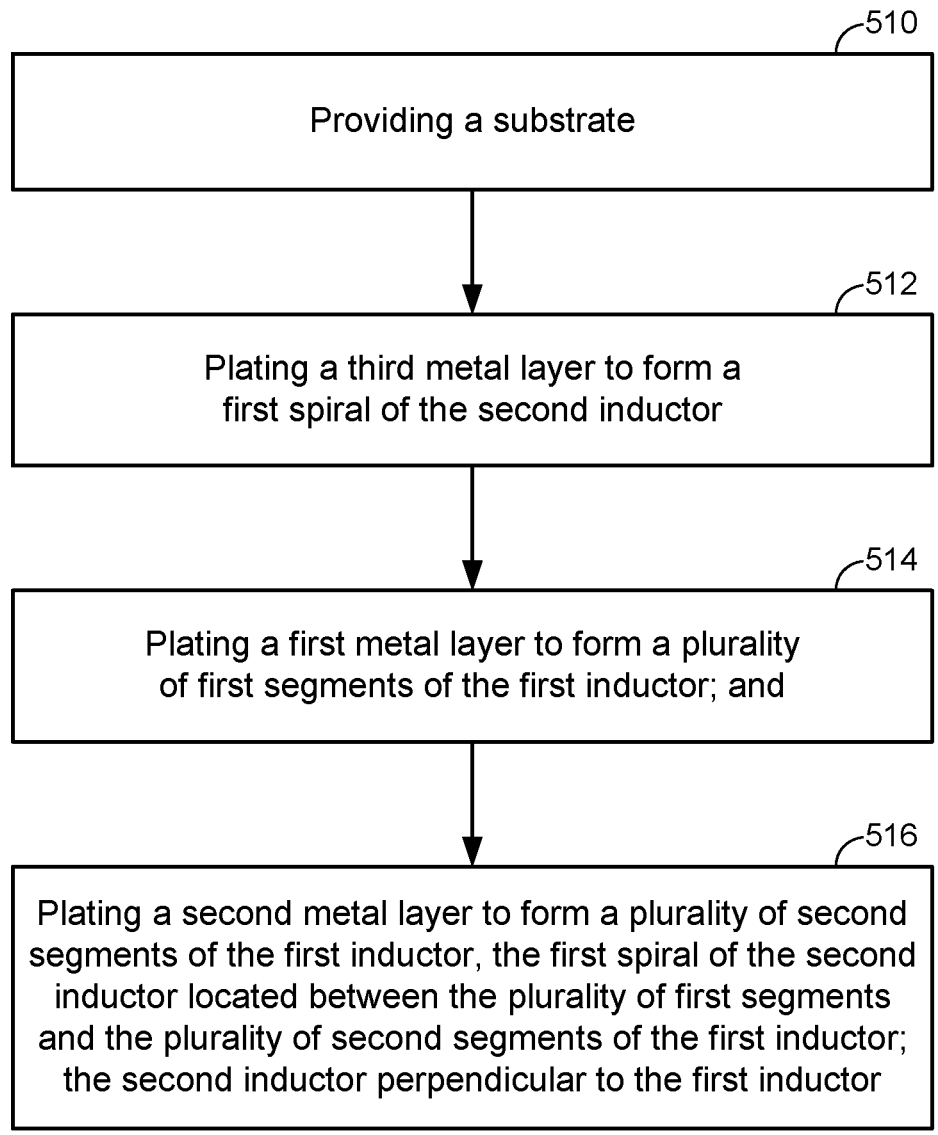
FIG. 5 illustrates an exemplary flow diagram of a high-level method for manufacturing perpendicular inductors integrated in a substrate.

Exemplary Flow Diagram of a Method for Manufacturing Perpendicular Inductors Integrated in a Substrate FIG. 5 illustrates an exemplary flow diagram of a high-level method for manufacturing perpendicular inductors integrated in a substrate (e.g., package substrate). It should be noted that for the purpose of clarity and simplification, the flow diagram of FIG. 5 does not necessarily include all the steps of manufacturing. Moreover, in some instances, several steps may have been combined into a single step to simplify the description of the sequences.

The method includes providing a substrate at block 510. The substrate may have a core or be coreless. Plating a third metal layer to form a first spiral of the second inductor is performed at block 512. Plating a first metal layer to form a plurality of first segments of the first inductor is performed at block 514. Plating a second metal layer to form a plurality of second segments of the first inductor, the first spiral of the second inductor located between the plurality of first segments and the plurality of second segments of the first inductor; the second inductor perpendicular to the first inductor is performed at block 516.

Exemplary Electronic Devices

Figure 6:
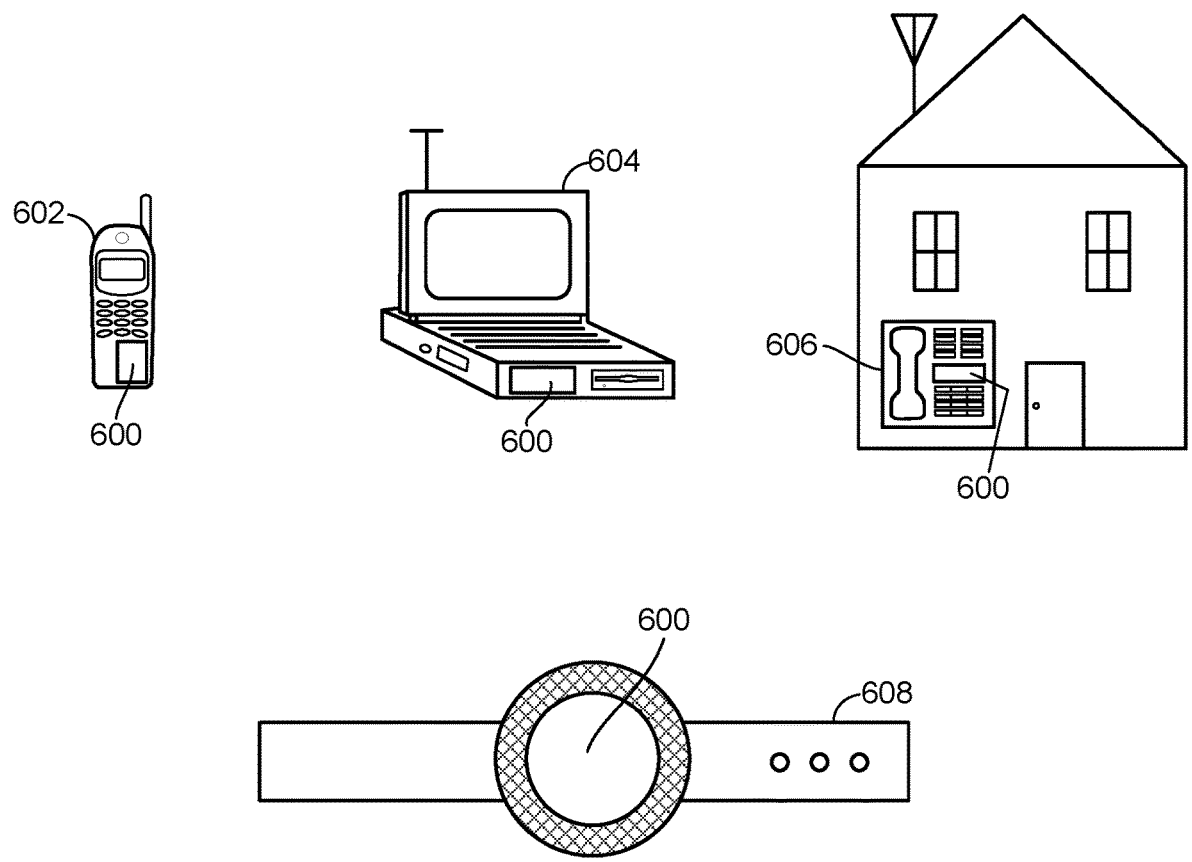
FIG. 6 illustrates various electronic devices that may include the various substrates, integrated devices, integrated device packages, semiconductor devices, dies, integrated circuits, and/or packages described herein.

FIG. 6 illustrates various electronic devices that may be integrated with any of the aforementioned substrate, integrated device, semiconductor device, integrated circuit, die, interposer, or package. For example, a mobile phone device 602, a laptop computer device 604, a fixed location terminal device 606, a wearable device 608 may include an integrated device 600 as described herein. The integrated device 600 may be, for example, any of the substrate, integrated circuits, dies, integrated devices, integrated device packages, integrated circuit devices, device packages, integrated circuit (IC) packages, package-on-package devices described herein. The devices 602, 604, 606, 608 illustrated in FIG. 6 are merely exemplary. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2 through 5, and/or 6 may be rearranged and/or combined into a single component, process, feature or function or embodied in several components, processes, or functions. Additional elements, components, processes, and/or functions may also be added without departing from the disclosure. It should also be noted that FIGS. 2 through 5, and/or 6 and its corresponding description in the present disclosure is not limited to substrates. In some implementations, FIGS. 2 through 5, and/or 6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a substrate;
   a first inductor integrated into the substrate, the first inductor including a plurality of first inductor windings in a first metal layer and a second metal layer;
   a second inductor integrated into the substrate, the second inductor including a first spiral in a third metal layer, the first spiral located at least partially inside the plurality of first inductor windings, wherein the second inductor is perpendicular to the first inductor,
   wherein the first inductor includes a plurality of first interconnects and a plurality of second interconnects for coupling the first inductor windings in the first metal layer to the first inductor windings in the second metal layer,
   wherein the second inductor includes a third side and a fourth side, wherein the third side and fourth side of the second inductor are bound by the plurality of first interconnects and the plurality of second interconnects of the first inductor,
   wherein each of the plurality of first inductor windings of the first inductor crosses the first spiral of the second inductor at least at two locations between the third side and the fourth side of the second inductor,
   wherein each one of the plurality of first interconnects and each one of the plurality of second interconnects includes a plurality of stacked vias and pads,
   wherein the first inductor and second inductor are not electrically coupled together, and
   wherein the number of the plurality of first inductor windings and the number of the plurality of stacked vias and pads depend on the amount of desired inductance.

2. The apparatus of claim 1, wherein the third metal layer is located between the first metal layer and the second metal layer.

3. The apparatus of claim 1, further comprising:
   wherein the first inductor is configured to generate a first magnetic field in a first direction;
   wherein the second inductor is configured to generate a second magnetic field in a second direction, wherein the second direction is different from the first direction.

4. The apparatus of claim 3, wherein the second magnetic field is generated from the second inductor.

5. The apparatus of claim 4, wherein the first magnetic field is generated from the plurality of first inductor windings.

6. The apparatus of claim 5, wherein the first direction of the first magnetic field and the second direction of the second magnetic field are perpendicular to each other.

7. The apparatus of claim 1, wherein a first side and a second side of the second inductor are not bounded by the first inductor.

8. The apparatus of claim 1, wherein the first inductor windings include a plurality of first segments and a plurality of second segments, the first spiral located between the plurality of first segments and the plurality of second segments.

9. The apparatus of claim 1, wherein a first side of the second inductor is perpendicular to the plurality of first interconnects and the plurality of second interconnects.

10. The apparatus of claim 8, further comprising:
    wherein the second inductor includes a second spiral on a fourth metal layer and a third spiral on a fifth metal layer, the second spiral and the third spiral located between the plurality of first segments and the plurality of second segments of the first inductor.

11. The apparatus of claim 10, wherein the fourth metal layer and the fifth metal layer are located between the first metal layer and the second metal layer.

12. The apparatus of claim 10, wherein a plurality of third interconnects is coupled to the first spiral, the first spiral is coupled to a plurality of fifth interconnects, the plurality of fifth interconnects couples the first spiral to the second spiral, the second spiral is coupled to the plurality of fourth interconnects, the plurality of fourth interconnects couples the second spiral to the third spiral, the third spiral is coupled to the plurality of fifth interconnects.

13. The apparatus of claim 10, wherein the stacked vias and pads configured to provide space for the first spiral, second spiral, and third spiral to be located between the plurality of first segments and the plurality of second segments.

14. The apparatus of claim 1, wherein the substrate including the first inductor and second inductor is part of a duplexer circuit.

15. The apparatus of claim 1, wherein the apparatus is incorporated into a device selected from a group consisting of a music player, a video player, an entertainment unit, a navigation device, a communications device, a mobile device, a mobile phone, a smart phone, a personal digital assistant, a fixed location terminal or server, a tablet computer, a wearable computing device, and a laptop computer.

* * * * *